US011749529B2

(12) United States Patent
Topaloglu et al.

(10) Patent No.: US 11,749,529 B2
(45) Date of Patent: Sep. 5, 2023

(54) SELF-ALIGNED DOUBLE PATTERNING WITH SPACER-MERGE REGION

(71) Applicant: International Business Machines Corporation, Armonk, NY (US)

(72) Inventors: Rasit Onur Topaloglu, Poughkeepsie, NY (US); Kafai Lai, Poughkeepsie, NY (US); Dongbing Shao, Briarcliff Manor, NY (US); Zheng Xu, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 17/677,469

(22) Filed: Feb. 22, 2022

(65) Prior Publication Data

US 2022/0181154 A1 Jun. 9, 2022

Related U.S. Application Data

(62) Division of application No. 16/806,261, filed on Mar. 2, 2020, now Pat. No. 11,302,532.

(51) Int. Cl.
*H01L 21/033* (2006.01)
*H01L 23/528* (2006.01)
(Continued)

(52) U.S. Cl.
CPC ...... *H01L 21/0337* (2013.01); *H01L 21/0332* (2013.01); *H01L 21/31144* (2013.01);
(Continued)

(58) Field of Classification Search
CPC ............ H01L 21/0337; H01L 21/0332; H01L 21/31144; H01L 21/76802; H01L 21/76877; H01L 23/528; H01L 21/76816
(Continued)

(56) References Cited

U.S. PATENT DOCUMENTS 8,943,445 B2   1/2015 Chen et al.
8,954,913 B1   2/2015 Yuan et al.
(Continued)

OTHER PUBLICATIONS

J. Yu et al., "Understanding the Critical Challenges of Self-Aligned Octuple Patterning," Proceedings of the SPIE, Optical Microlithography XXVII, Mar. 31, 2014, vol. 9052, 15 pages.
(Continued)

*Primary Examiner* — Caleen O Sullivan
(74) *Attorney, Agent, or Firm* — Joseph P. Curcuru; Ryan, Mason & Lewis, LLP

(57) ABSTRACT

A method of forming a semiconductor structure includes forming a dielectric layer, forming a plurality of mandrel lines over the dielectric layer, and forming a plurality of non-mandrel lines over the dielectric layer between adjacent ones of the mandrel lines utilizing self-aligned double patterning. The method also includes forming at least one spacer-merge region extending from a first portion of a first one of the mandrel lines to a second portion of a second one of the mandrel lines in a first direction and covering at least a portion of one or more of the non-mandrel lines between the first mandrel and the second mandrel in a second direction orthogonal to the first direction. The method further includes forming a plurality of trenches in the dielectric layer by transferring a pattern of (i) the mandrel lines and (ii) portions of the non-mandrel lines outside the at least one spacer-merge region.

20 Claims, 11 Drawing Sheets

(51) Int. Cl.
*H01L 21/768* (2006.01)
*H01L 21/311* (2006.01)

(52) U.S. Cl.
CPC .. *H01L 21/76802* (2013.01); *H01L 21/76877* (2013.01); *H01L 23/528* (2013.01)

(58) Field of Classification Search
USPC .......................... 438/703; 430/312; 257/443
See application file for complete search history.

(56) References Cited

U.S. PATENT DOCUMENTS

| | | | |
|---|---|---|---|
| 9,093,378 | B2 | 7/2015 | Kim et al. |
| 9,412,612 | B2 | 8/2016 | Yang |
| 9,449,880 | B1 | 9/2016 | Tseng et al. |
| 9,740,092 | B2 | 8/2017 | Hamouda |
| 9,911,646 | B2 | 3/2018 | Tsai et al. |
| 9,911,652 | B1 | 3/2018 | Clevenger et al. |
| 11,302,532 | B2 * | 4/2022 | Topaloglu ........... H01L 21/0332 |
| 2009/0087986 | A1 | 4/2009 | Lee et al. |
| 2014/0245239 | A1 | 8/2014 | Du et al. |
| 2018/0144976 | A1 | 5/2018 | Law et al. |
| 2020/0258776 | A1 | 8/2020 | Cheng |

OTHER PUBLICATIONS

Y. Chen et al., "Mandrel and Spacer Engineering Based Self-Aligned Triple Patterning," Proceedings of the SPIE, Advanced Etch Technology for Nanopatterning, Mar. 16, 2012, vol. 8328, 10 pages.

D. Vender et al., "Selective Reactive Ion Etching of Phosphorous-Doped Oxide Over Undoped SiO2," Journal of Vacuum Science & Technology A: Vacuum, Surfaces, and Films, Apr. 1993, vol. 11, No. 2, pp. 279-285.

H. Kim et al., "Novel Flowable CVD Process Technology for sub-20nm Interlayer Dielectrics," IEEE International Interconnect Technology Conference (IITC), Jun. 4-6, 2012, 3 pages.

List of IBM Patents or Patent Applications Treated as Related.

* cited by examiner

100

200

300

400

700

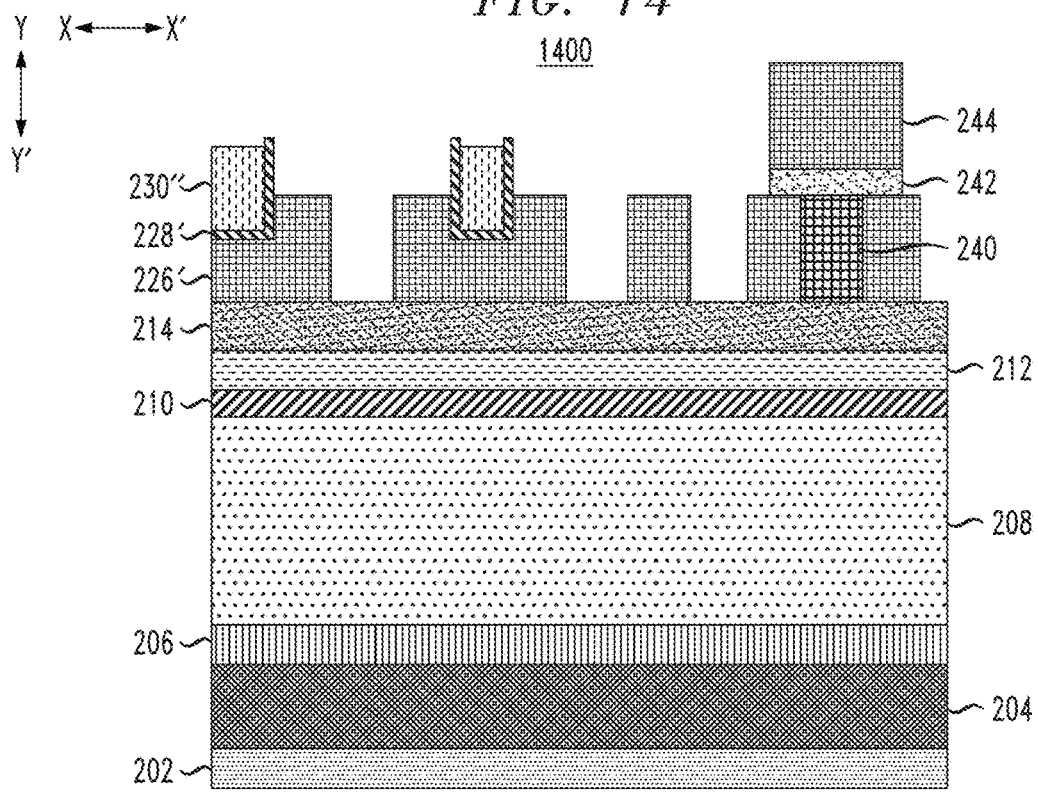
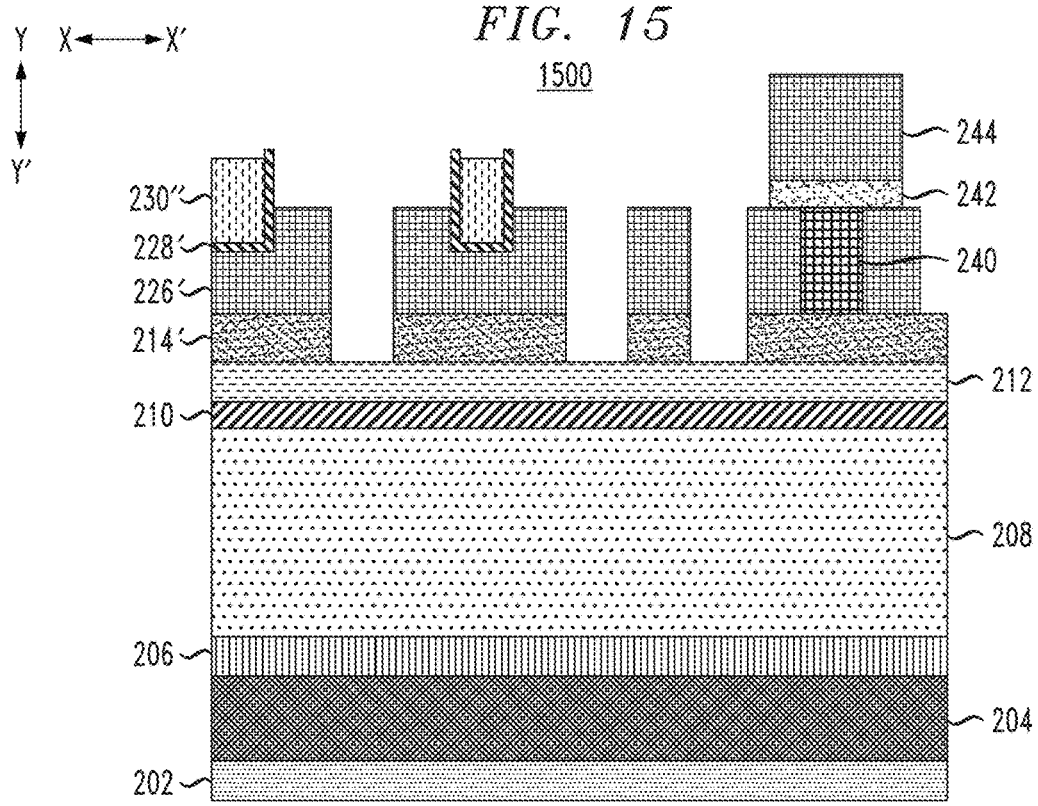

1600

1700

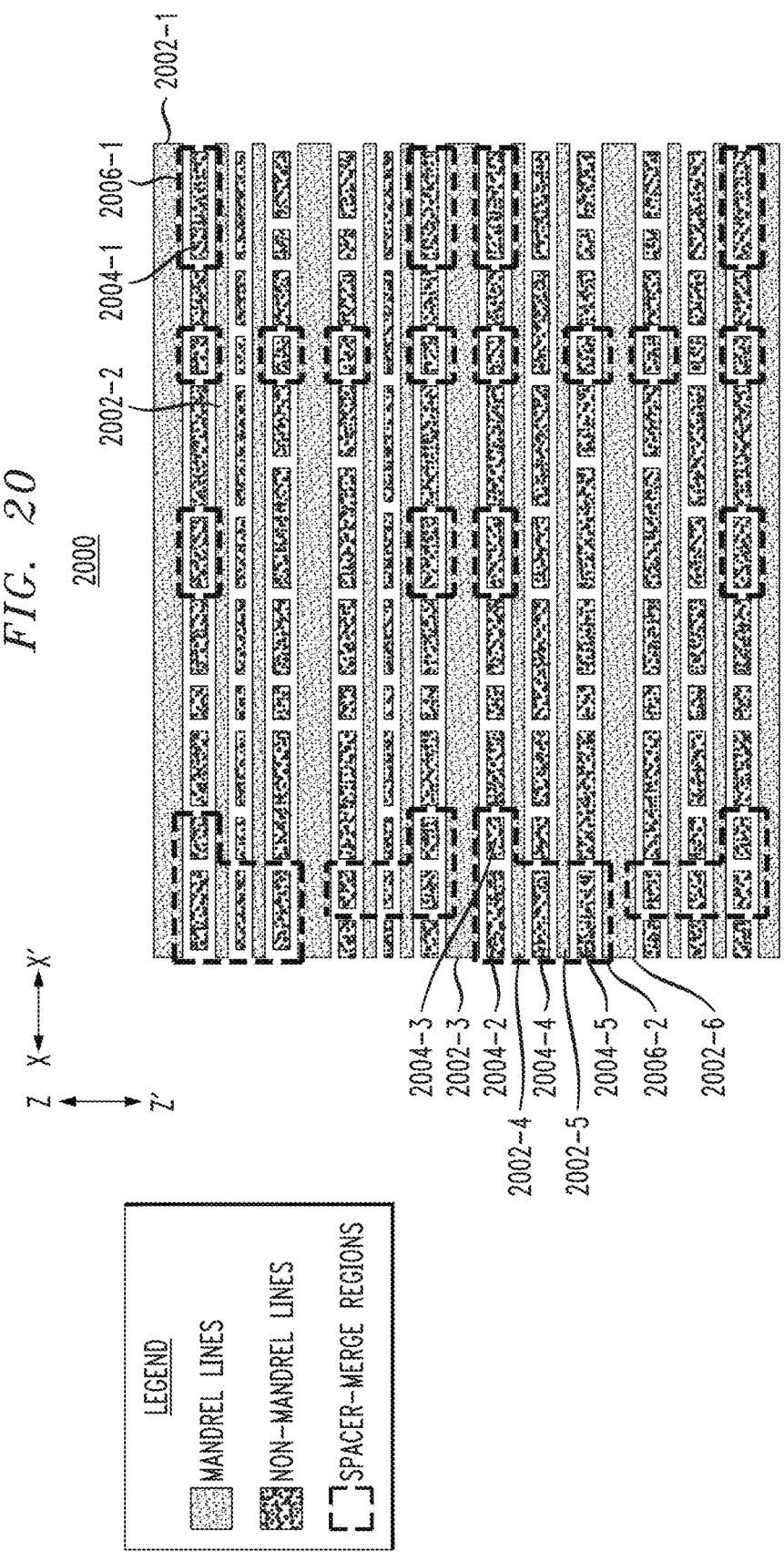

SELF-ALIGNED DOUBLE PATTERNING WITH SPACER-MERGE REGION

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater number of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for self-aligned double patterning with spacer-merge regions.

In one embodiment, a method of forming a semiconductor structure comprises forming a dielectric layer, forming a plurality of mandrel lines over the dielectric layer, and forming a plurality of non-mandrel lines over the dielectric layer between adjacent ones of the plurality of mandrel lines utilizing self-aligned double patterning. The method also comprises forming at least one spacer-merge region, the at least one spacer-merge region extending from a first portion of a first one of the plurality of mandrel lines to a second portion of a second one of the plurality of mandrel lines in a first direction and covering at least a portion of one or more of the plurality of non-mandrel lines between the first mandrel and the second mandrel in a second direction orthogonal to the first direction. The method further comprises forming a plurality of trenches in the dielectric layer by transferring a pattern of (i) the plurality of mandrel lines and (ii) portions of the plurality of non-mandrel lines outside the at least one spacer-merge region.

In another embodiment, a semiconductor structure comprises a dielectric layer and a plurality of interconnect lines disposed in a plurality of trenches in the dielectric layer. The plurality of trenches comprise a first set of trenches defined by a plurality of mandrel lines and a second set of trenches defined by a plurality of non-mandrel lines outside at least one spacer-merge region. The at least one spacer-merge region extends from a first portion of a first one of the plurality of mandrel lines to a second portion of a second one of the plurality of mandrel lines in a first direction and covers at least a portion of one or more of the plurality of non-mandrel lines between the first mandrel and the second mandrel in a second direction orthogonal to the first direction.

In another embodiment, an integrated circuit comprises an interconnect structure comprising a dielectric layer and a plurality of interconnect lines disposed in a plurality of trenches in the dielectric layer. The plurality of trenches comprise a first set of trenches defined by a plurality of mandrel lines and a second set of trenches defined by a plurality of non-mandrel lines outside at least one spacer-merge region. The at least one spacer-merge region extends from a first portion of a first one of the plurality of mandrel lines to a second portion of a second one of the plurality of mandrel lines in a first direction and covers at least a portion of one or more of the plurality of non-mandrel lines between the first mandrel and the second mandrel in a second direction orthogonal to the first direction.

BRIEF DESCRIPTION OF THE DRAWINGS

FIG. 14 depicts a side cross-sectional view of the FIG. 13 structure following optional block-level patterning, according to an embodiment of the invention.

FIG. 15 depicts a side cross-sectional view of the FIG. 14 structure following etching of the exposed hard mask layer, according to an embodiment of the invention.

FIG. 20 depicts a top-down view of a structure with mandrel lines, non-mandrel lines and spacer-merge regions, according to an embodiment of the invention.

DETAILED DESCRIPTION

Figure 1:
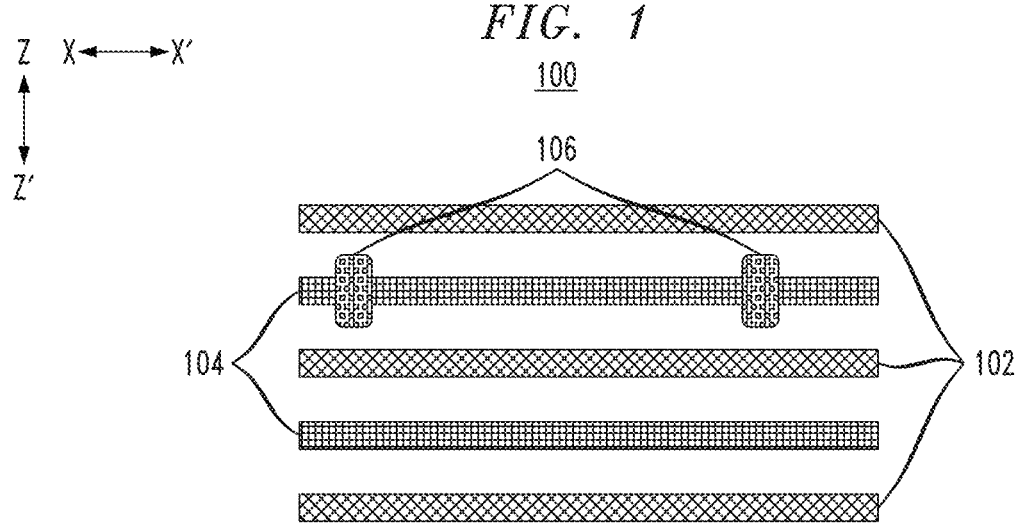
FIG. 1 depicts a top-down view of a structure having dummy lines printed on a wafer following self-aligned double patterning cuts, according to an embodiment of the invention.

Illustrative embodiments of the invention may be described herein in the context of illustrative methods for forming interconnect lines using self-aligned double patterning with spacer-merge regions, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

For continued scaling, there is a need for forming features such as fin structures or interconnect structures that connect various FinFET devices. These structures are separated by smaller distances (e.g., fins with pitch in the range of one to a few nanometers or interconnects in tens of nanometers). As lithography processes reach the limits of optical resolution, new patterning processes are used to create devices with critical dimension (CD) beyond the capabilities of traditional lithography. One such technique is the use of multiple patterning, such as self-aligned double patterning (SADP) or sidewall image transfer (SIT), self-aligned quadruple patterning (SAQP), etc. Such multiple patterning processes generally include the use of deposition and etch-back to create and transfer patterns to underlying layers, such as where spacers are formed on the sidewalls of sacrificial mandrels, with the sacrificial mandrels being removed to leave a pattern of spacers used to etch features in underlying layers at sub-lithographic dimensions.

In some multiple patterning processes, such as SADP processes, lines are first printed and the line ends are defined using small cuts. Such cuts for the line ends result in electrically floating "dummy" lines remaining and printing onto the wafer. Such electrically floating dummy lines result in increased capacitive coupling and reduce performance (e.g., by about 3% or more). This issue, referred to herein as "floating fill", is illustrated in the top-down view 100 of FIG. 1. FIG. 1 shows a set of mandrel lines 102 and non-mandrel lines 104 formed using a SADP process. FIG. 1 also shows line-end cuts 106 on one of the non-mandrel lines 104. If no vias are present, the portion of the non-mandrel line 104 between the line-end cuts 106 will print on the wafer and result in a performance penalty. Illustrative embodiments provide processes for eliminating such non-mandrel dummy lines from printing on the wafer. Embodiments are able to achieve significant non-mandrel density reduction (e.g., of about 21.5% or more in some embodiments).

In some embodiments, a process is used where a first hard mask is grown after a first spacer deposition for an SADP process. The first hard mask may comprise a silicon nitride ($Si_xN_y$) material such as $Si_3N_4$ formed using atomic layer deposition (ALD), with a thickness in the range of about 10 to 100 angstroms (Å). A second spacer is grown around the first spacer of a mandrel in the SADP process. The second spacer may be formed by gap filling flowable chemical vapor deposition (CVD) of silicon dioxide (SiO) or silicon carbon oxygen hydrogen (SiCOH) with a thickness in the range of about 10 to 100 nanometers (nm). The second spacer may be shared with a neighboring mandrel. The second spacer may then be etched-back to the first hard mask. A second hard mask may be deposited after the etch-back to the first hard mask. The second hard mask may be patterned using a mask that defines "spacer-merge" regions (e.g. regions where non-mandrel lines should not be printed). The second hard mask may prevent etch out of the second spacer in the regions where a dummy fill is not desired. The process may include further etch steps and a mandrel pull, where the second spacer remains over the regions where the dummy fill is not desired. The SADP process may then proceed. By preventing printing of the unwanted dummy lines, various benefits are provided such as reduced metal density, reduced coupling capacitance, and increased circuit performance.

Double spacer processes may be used to create additional wires only, not for merging spacers to block unwanted dummy lines. Such double spacer processes do not utilize a flowable gap fill and thus would only provide a 2× instead of a 1× spacer and thus cannot fill wide areas. Such double spacer processes would thus still result in the formation of dummy lines (though narrower than would otherwise be formed). The process flow described above and in further detail below enables eliminating the unwanted dummy lines completely.

An illustrative process for preventing printing of unwanted dummy lines will now be described in further detail with respect to FIGS. 2-19.

Figure 2:
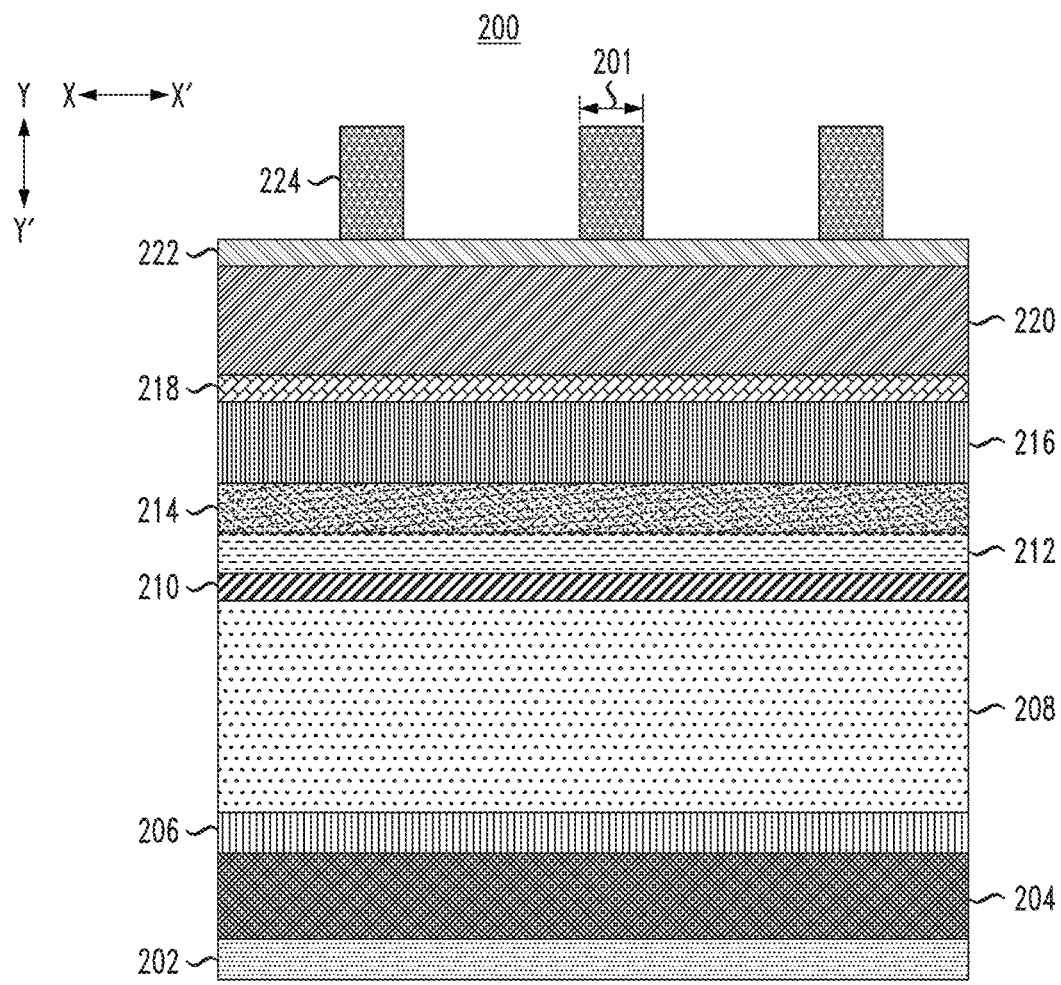
FIG. 2 depicts a side cross-sectional view of a stack of materials over which a resist layer is patterned, according to an embodiment of the invention.

FIG. 2 shows a side cross-sectional view 200 of a stack of materials including a substrate 202, a dielectric layer 204, an etch stop layer 206, a dielectric layer 208, a hard mask layer 210, a dielectric layer 212, a hard mask layer 214, a mandrel layer comprising an organic dielectric layer (ODL) material 216, an oxide layer 218, an ODL 220, and a coating layer 222. A resist layer 224 is patterned over the coating layer 222 as illustrated.

The substrate 202 may comprise a semiconductor substrate formed of silicon (Si), although other suitable materials may be used. For example, the substrate 202 can include any suitable substrate structure, e.g., a bulk semiconductor. The substrate 202 can include a silicon-containing material. Illustrative examples of Si-containing materials suitable for the substrate 202 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. The size of the substrate 202 may vary, such as based on the number of features or devices that will be formed thereon.

The dielectric layer 204 may be formed of tetraethyl orthosilicate (TEOS) or another suitable material. The dielectric layer 204 may have a height or vertical thickness (in direction Y-Y') of about 5,000 Å. The term "about" in this instance should be understood to encompass a range of thicknesses, such as from 50% to 200% of the stated amount (e.g., from 2,500 to 10,000 Å) or from 10% to 1000% of the stated amount (e.g., from 500 to 50,000 Å). The use of the term about below with regards to other thickness and distances should similarly be understood to encompass a range of the stated amount.

The etch stop layer 206 may be formed of nitrogen-doped silicon carbide (NBLoK) or another suitable material. The etch stop layer 206 may have a height or vertical thickness (in direction Y-Y') of about 200 Å.

The dielectric layer 208 may be formed of an ultra low-k (ULK) dielectric or other suitable material. The dielectric layer 208 may have a height or vertical thickness (in direction Y-Y') of about 770 Å.

The hard mask layer 210, also referred to herein as hard mask (HM) 210, may be formed of octamethylcyclotetrasiloxane (OMCTS) or another suitable material. The HM 210 may have a height or vertical thickness (in direction Y-Y') of about 50 Å.

The dielectric layer 212 may be formed of phosphorus (P)-doped TEOS (pTEOS) or another suitable material, and is also referred to herein as TEOS 212. The TEOS 212 may have a height or vertical thickness (in direction Y-Y') of about 150 Å.

The hard mask layer 214, also referred to as HM 214, may be formed of titanium nitride (TiN) or another suitable material that may be etched selective to the hard mask materials used in layer 210. The HM 214 may have a height or vertical thickness (in direction Y-Y') of about 300 Å.

The mandrel layer 216 may be formed of an organic dielectric material such as ODL-401 commercially available from Shin-Etsu, Co. The mandrel layer 216 may have a height or vertical thickness (in direction Y-Y') of about 500 Å.

The oxide layer 218 may be formed of a low temperature oxide (LTO) material or other suitable material. The oxide layer 218, also referred to herein as LTO 218, may have a height or vertical thickness (in direction Y-Y') of about 150 Å.

The ODL 220 may be formed of any suitable organic hard mask material such as ODL-401. The ODL 220 may have a height or vertical thickness (in direction Y-Y') of about 1000 Å.

The coating layer 222 may be formed of a silicon-containing antireflective coating (SiARC) material or another suitable material. The coating layer 222 may have a height or vertical thickness (in direction Y-Y') of about 350 Å.

The layers 202 through 222 may each have a width or horizontal thickness (in direction X-X') that varies as desired, such as based on the number of features or devices to be formed thereon. The layers 202 through 222 may each be formed using various deposition processes, such as one or more of CVD, physical vapor deposition (PVD), ALD, spin-on coating, etc.

Figure 3:
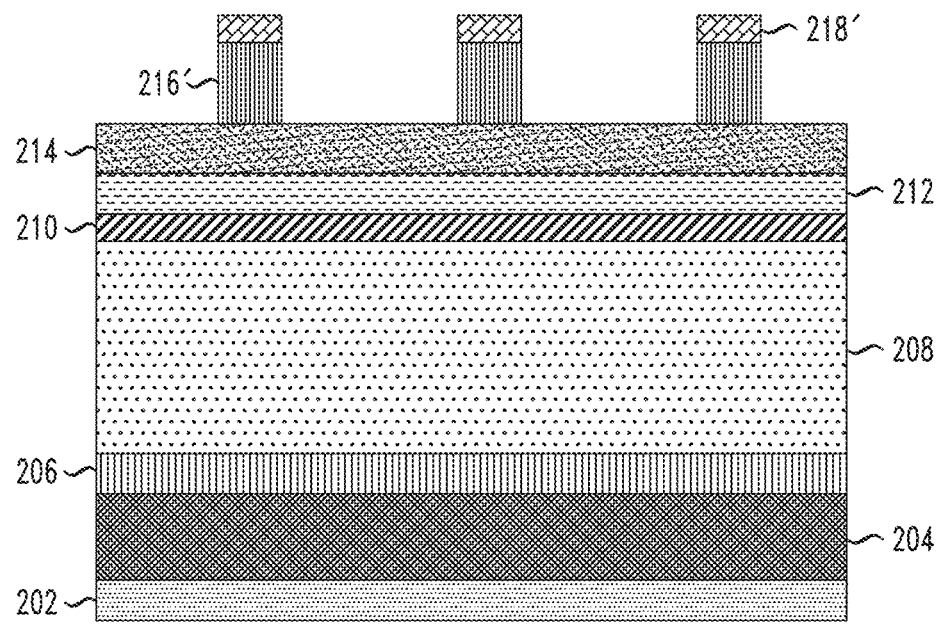
FIG. 3 depicts a side cross-sectional view of the FIG. 2 structure following etching to form mandrels, according to an embodiment of the invention.

As shown in FIG. 3, a resist layer 224 is patterned over the coating layer 222. The resist layer 224 may be formed of photoresist or another suitable material. The resist layer 224 is patterned as a set of pillars, each of which has a width or horizontal thickness 201 of about 35 nm. Each of the pillars of the resist layer 224 may have a height or vertical thickness (in direction Y-Y') of about 900 Å.

FIG. 3 shows a side cross-sectional view 300 of the FIG. 2 structure following etching (e.g., using reactive-ion etching (RIE) or other suitable processing) to form a set of mandrels 216' from the mandrel layer 216. The mandrels 216' correspond to the pattern of the resist layer 224 formed over the coating layer 222 in the FIG. 2 structure. As a result of this etching, the resist layer 224, coating layer 222 and ODL layer 220 are removed. Portions of the LTO 218 and mandrel layer 216 below the resist layer 224 remain, and are labeled as mandrels 216' and LTO 218' in FIG. 2.

Figure 4:
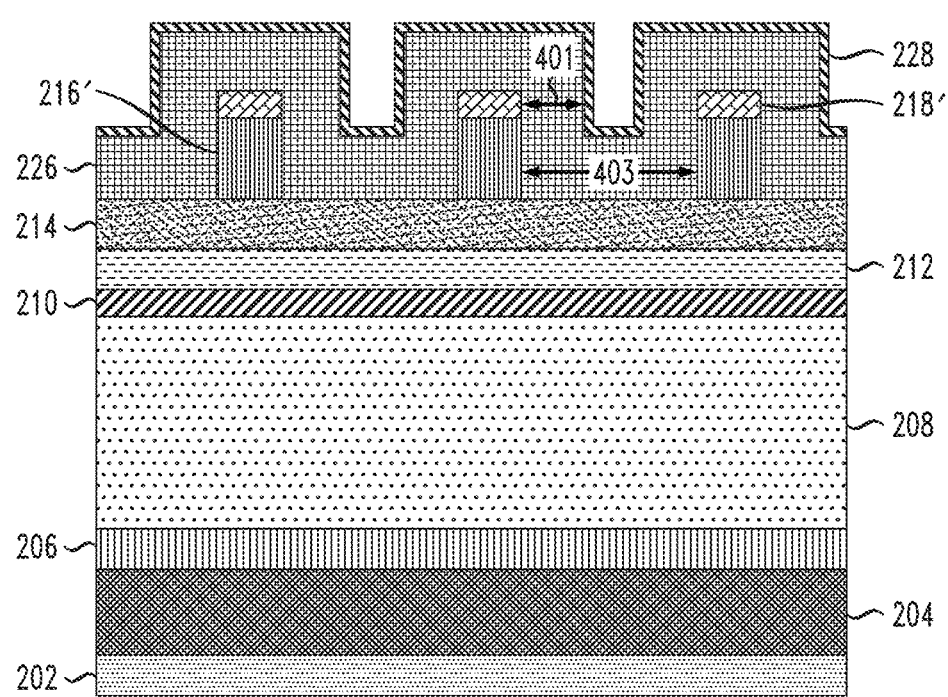
FIG. 4 depicts a side cross-sectional view of the FIG. 3 structure following formation of a first spacer and a hard mask layer, according to an embodiment of the invention.

FIG. 4 shows a side cross-sectional view 400 of the FIG. 3 structure following deposition of a first spacer 226 over the FIG. 3 structure, and following formation of a hard mask layer 228 over the first spacer 226.

The first spacer 226 may be formed of a LTO material. The first spacer 226 may have a uniform thickness in the range of about 28-32 nm (e.g., distance 401 is about 28-32 nm, where the distance 403 between the mandrels 216 is about 67.5 nm).

The hard mask layer 228, also referred to herein as HM 228, may be formed using ALD or other suitable processing. The HM 228 may be formed of a $Si_xN_y$ material such as $Si_3N_4$ or another suitable material. The HM 228 may have a uniform thickness of about 50 Å.

Figure 5:
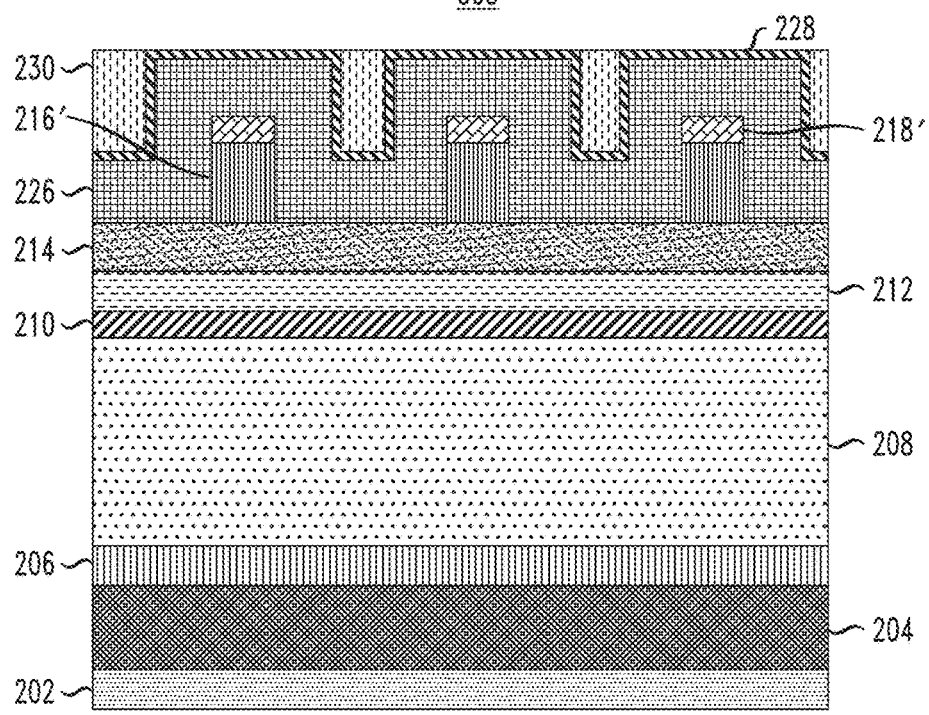
FIG. 5 depicts a side cross-sectional view of the FIG. 4 structure following formation and etch back of a second spacer, according to an embodiment of the invention.

FIG. 5 shows a side cross-sectional view 500 of the FIG. 4 structure following formation of a second spacer 230. The second spacer 230 may be formed by gap filling using flowable CVD, followed by etch-back to the HM 228. The second spacer 230 may be formed of $SiO_2$, SiCOH, or another suitable material. The second spacer 230 may initially have a height or vertical thickness (in direction Y-Y') of about 320 Å, prior to etch-back processing where the second spacer 230 has a height that matches that of the HM 228.

Figure 6:
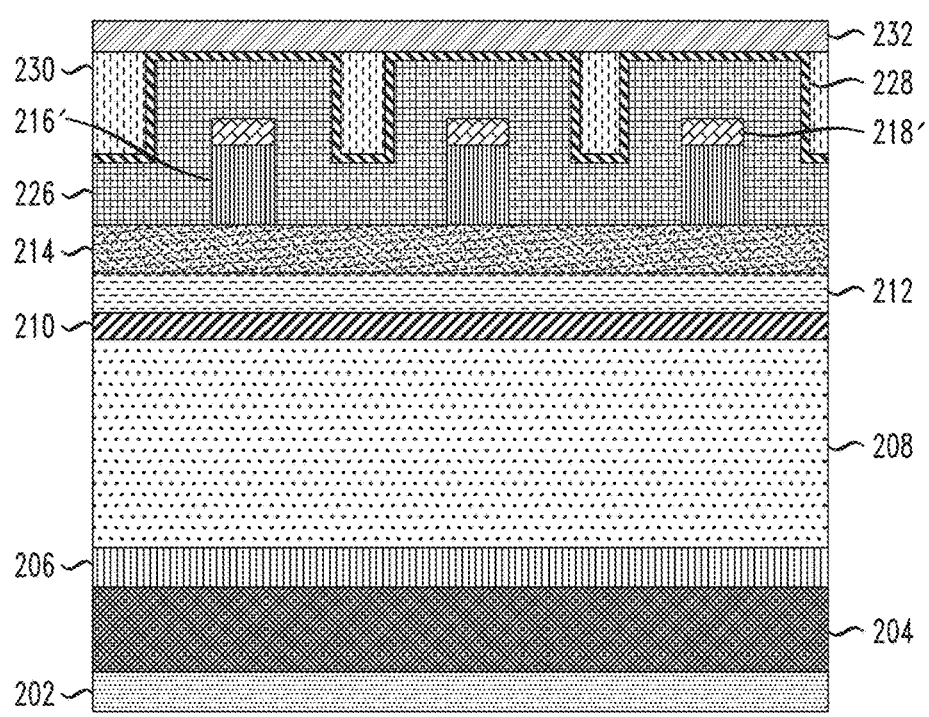
FIG. 6 depicts a side cross-sectional view of the FIG. 5 structure following formation of another hard mask layer, according to an embodiment of the invention.

FIG. 6 shows a side cross-sectional view 600 of the FIG. 5 structure following formation of a hard mask layer 232. The hard mask layer 232, also referred to herein as HM 232, may be formed of titanium nitride (TiN) or another suitable material that may be removed selective to the hard mask material of HM 228. The HM 232 may be formed using any suitable deposition process. The HM 232 may have a height or vertical thickness (in direction Y-Y') of about 300 Å.

Figure 7:
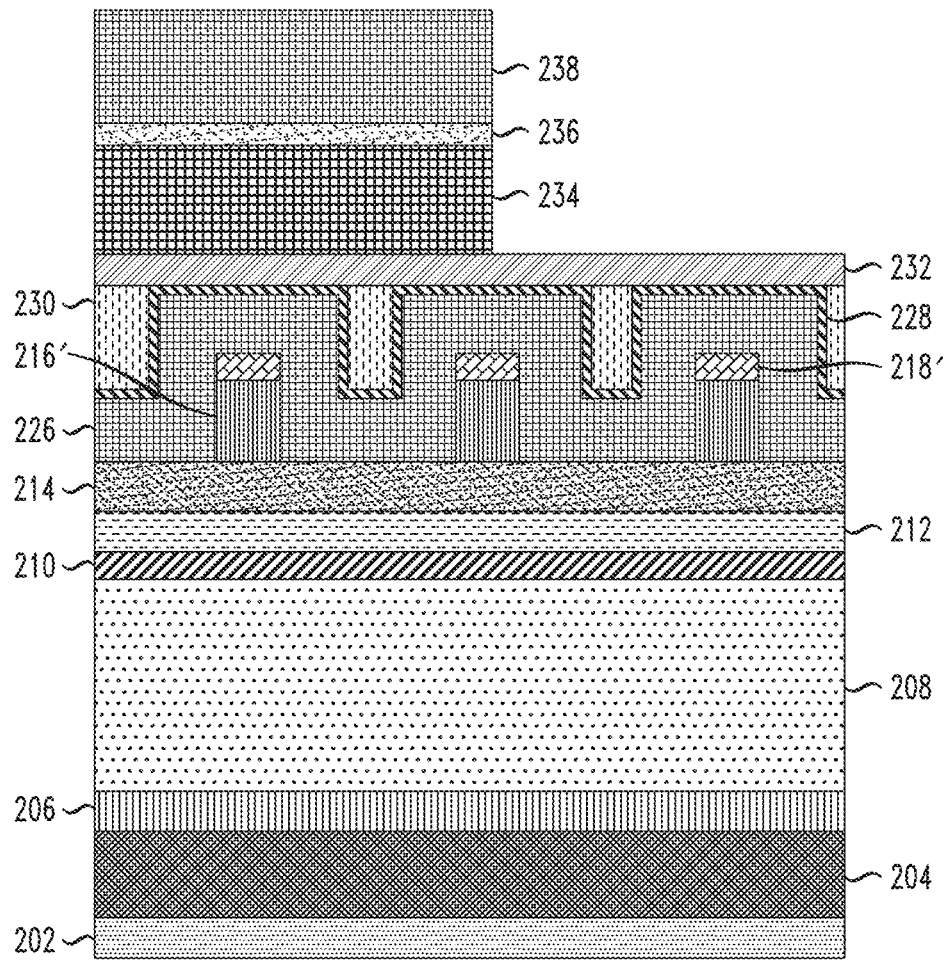
FIG. 7 depicts a side cross-sectional view of the FIG. 6 structure following patterning of a spacer-merge region, according to an embodiment of the invention.

FIG. 7 shows a side cross-sectional view 700 of the FIG. 6 structure following patterning for a spacer-merge region via formation of an ODL 234, a coating layer 236 and a resist layer 238.

The ODL 234 may be formed of similar materials as the ODL 220, and using similar processing such as spin-on coating. The ODL 234 may have a height or vertical thickness (in direction Y-Y') of about 1000 Å.

The coating layer 236 may be formed of similar materials as the coating layer 222 (e.g., a SiARC material), and may also be referred to herein as SiARC 236. The SiARC 236 may be formed using similar processing as that used for formation of coating layer 222. The SiARC 236 may have a height or vertical thickness (in direction Y-Y') of about 350 Å.

The resist layer 238 may be formed of similar materials and using similar processing as that used for formation of the resist layer 224. The resist layer 238 may have a height or vertical thickness (in direction Y-Y') in the range of about 900 Å. The ODL layer 234 and SiARC 236 may initially be formed over the entire structure, followed by patterning of the resist layer 238 and removing portions of the ODL layer 234 and SiARC 236 exposed by the patterned resist layer 238.

The ODL 234, SiARC 236 and resist layer 238, as noted above, define a spacer-merge region. The spacer-merge region permits formation of two mandrels with a large space between them, but without leaving a non-mandrel dummy that couples the two mandrels. In this way, SADP processes where the lines are first printed and line ends are defined by small cuts avoid leaving electrically-floating dummy lines remaining following the cuts that print onto the wafer. Such electrically-floating dummy lines, as noted above, increase capacitive coupling and reduce performance (e.g., by about 3%). The spacer-merge region enables a process flow for eliminating such non-mandrel lines from printing on the wafer, as will be described in further detail below.

Figure 8:
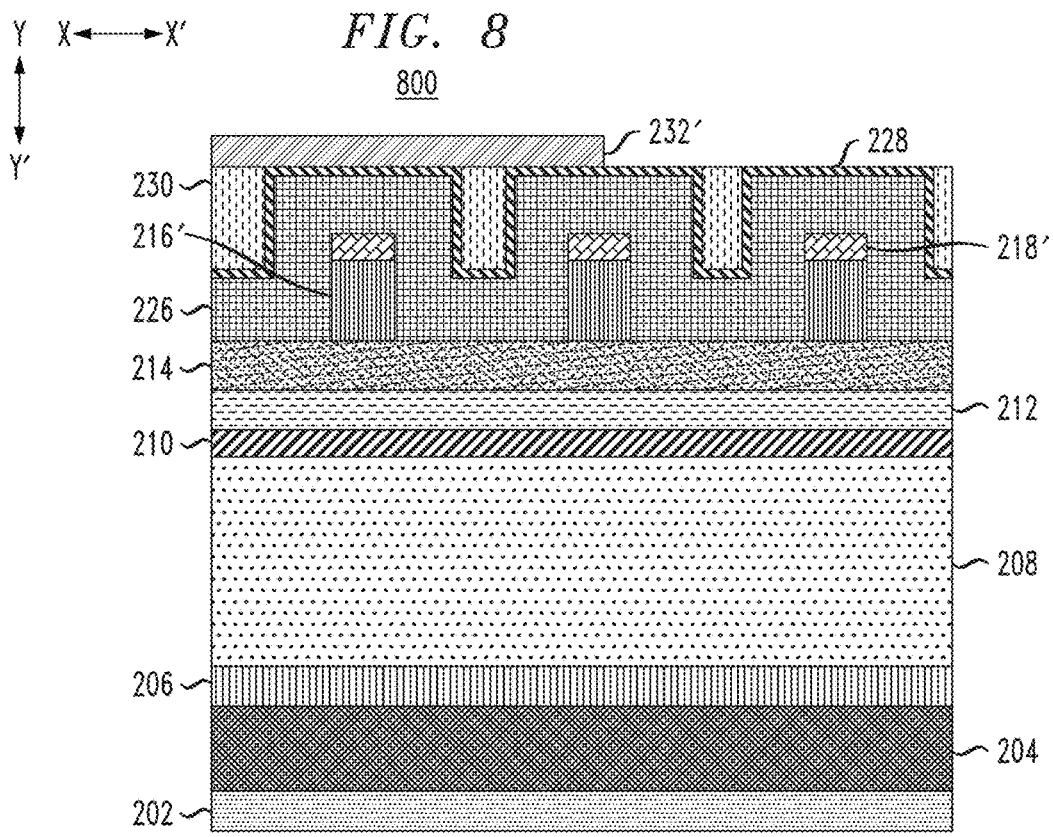
FIG. 8 depicts a side cross-sectional view of the FIG. 7 structure following etching of the hard mask layer exposed by the spacer-merge region, according to an embodiment of the invention.

FIG. 8 shows a side cross-sectional view 800 of the FIG. 7 structure following etching of portions of the HM 232 that are exposed by the spacer-merge region (e.g., portions of the HM 232 not covered by the ODL 234, SiARC 236 and resist layer 238 are removed). The remaining portion of the HM 232 is labeled as HM 232' in FIG. 8. The exposed portions of the HM 232 may be etched using any suitable etch processing that removes the hard mask material of the HM 232 but not the hard mask material of HM 228 or the material of the second spacer 230. Following etching of the exposed portions of the HM 232, the ODL 234, SiARC 236 and resist layer 238 may be removed.

Figure 9:
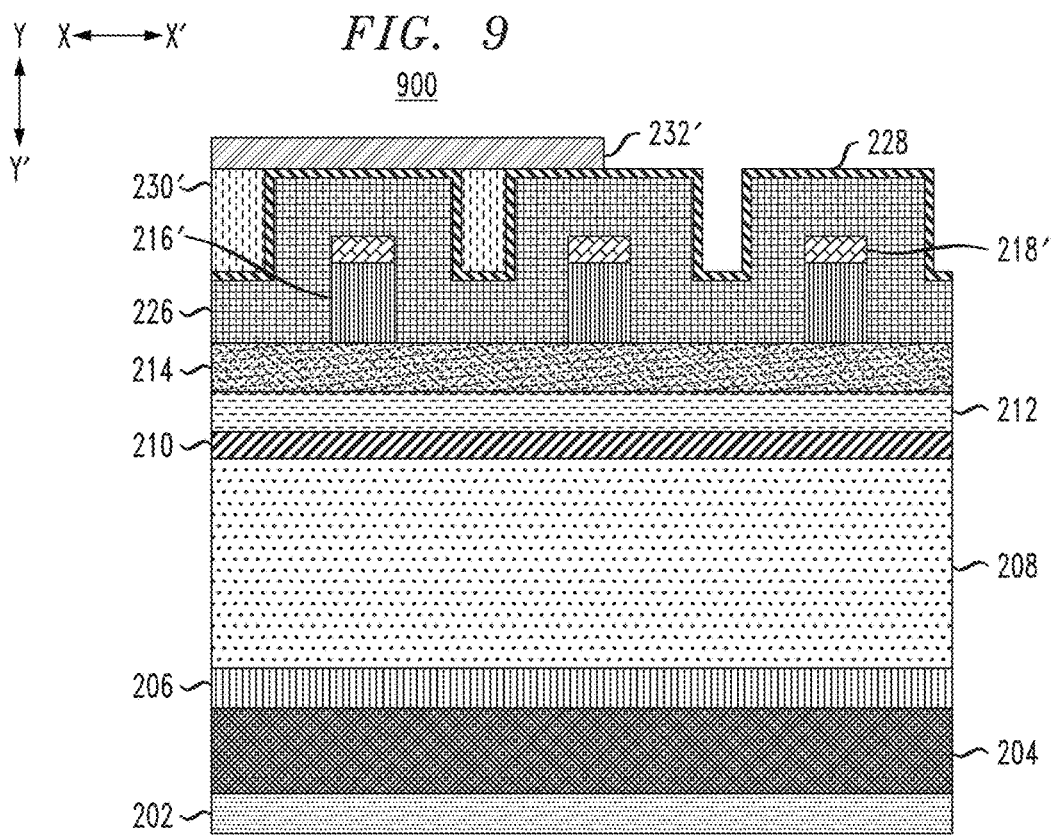
FIG. 9 depicts a side cross-sectional view of the FIG. 8 structure following selective etching of the second spacer, according to an embodiment of the invention.

FIG. 9 shows a side cross-sectional view 900 of the FIG. 8 structure following selective etching of the second spacer 230. Portions of the second spacer 230 not covered by the HM 232' are etched using any suitable processing which removes the material of the second spacer 230 but not the hard mask material of the HM 232' or HM 228. Remaining portions of the second spacer 230 are labeled as spacer 230'.

Figure 10:
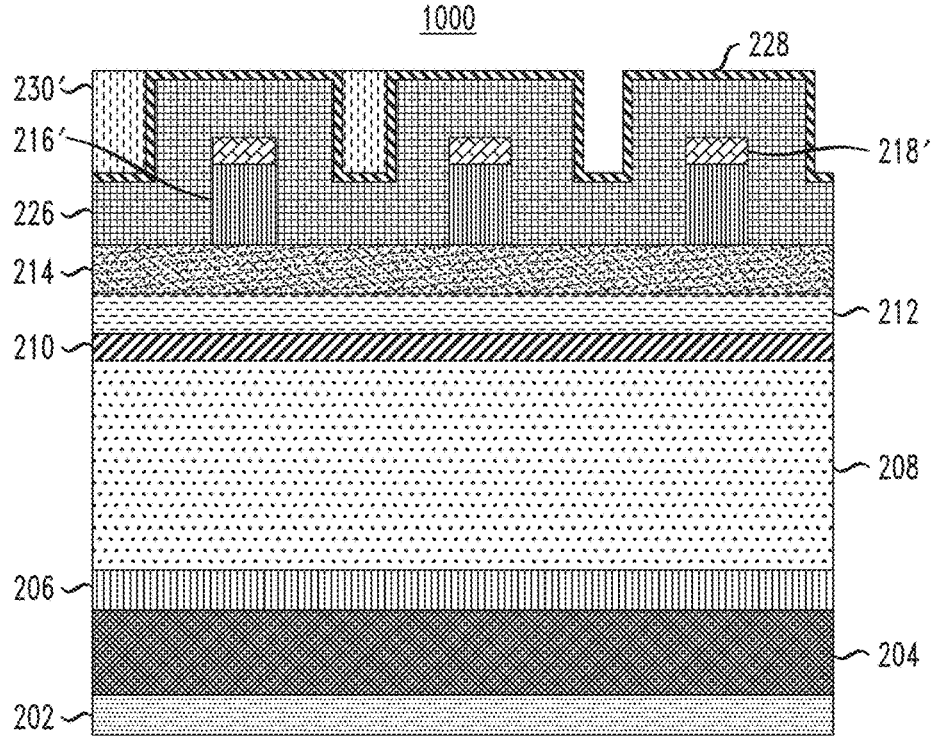
FIG. 10 depicts a side cross-sectional view of the FIG. 9 structure following removal of the exposed hard mask layer, according to an embodiment of the invention.

FIG. 10 shows a side cross-sectional view 1000 of the FIG. 9 structure following removal of the HM 232', using any suitable processing that removes the hard mask material of HM 232' but not the hard mask material of HM 228.

Figure 11:
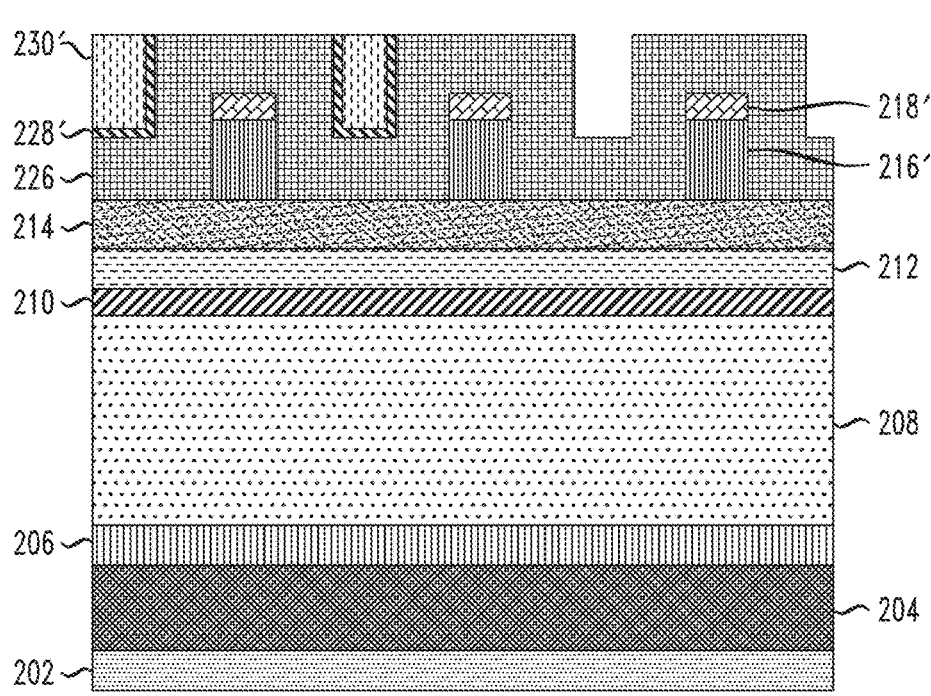
FIG. 11 depicts a side cross-sectional view of the FIG. 10 structure following an atomic layer deposition etch and an optional ash burn process, according to an embodiment of the invention.

FIG. 11 shows a side cross-sectional view 1100 of the FIG. 10 structure following an ALD etch and an optional ash burn process that removes portions of the HM 228 to avoid HM 228 "ears" being formed in subsequent processing. The remaining portions of the HM 228 are labeled as HM 228' in FIG. 11.

Figure 12:
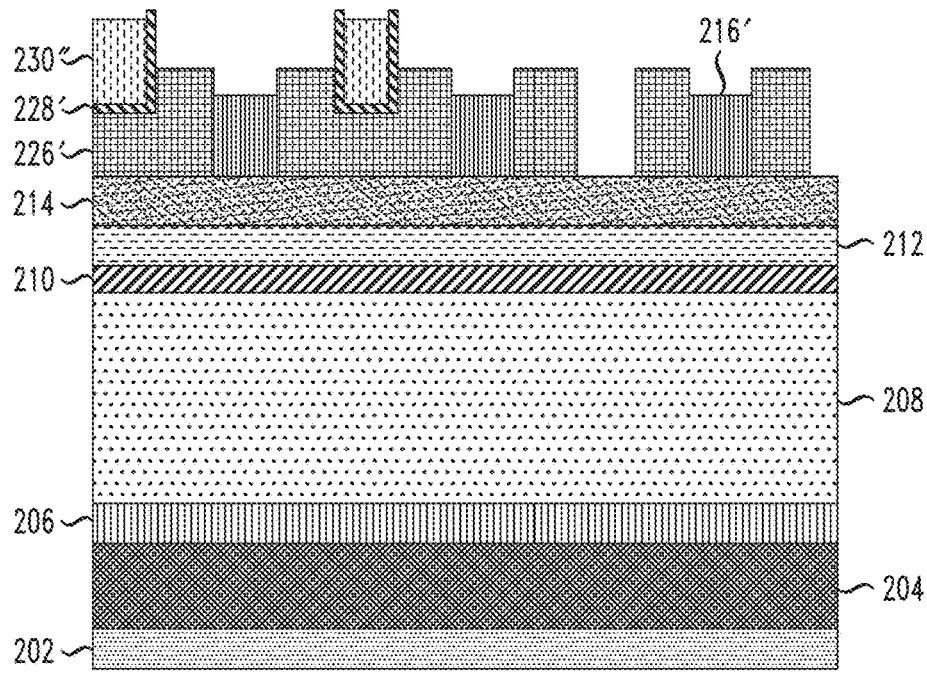
FIG. 12 depicts a side cross-sectional view of the FIG. 11 structure following a directional etch of the first spacer that is selective to the second spacer, according to an embodiment of the invention.

FIG. 12 shows a side cross-sectional view 1200 of the FIG. 11 structure following a directional etch of the first spacer 226 that is selective to the second spacer 230'. The first spacer 226 (e.g., which may be formed of undoped $SiO_2$ in some embodiments as noted above) may be etched selective to the second spacer 230' (e.g., which may be formed of a P-doped oxide or SiCOH as discussed above) using a selective RIE process. FIG. 12 shows that a portion of the second spacer 230' is removed, with remaining portions being labeled as second spacer 230". It should be noted that, even if all of the second spacer 230' were removed during the directional etch of the first spacer 226, the HM 228' will still provide an etch stop. The etch of the first spacer 226 may also remove the LTO 218' as illustrated. Remaining portions of the first spacer 226 are labeled as 226'.

Figure 13:
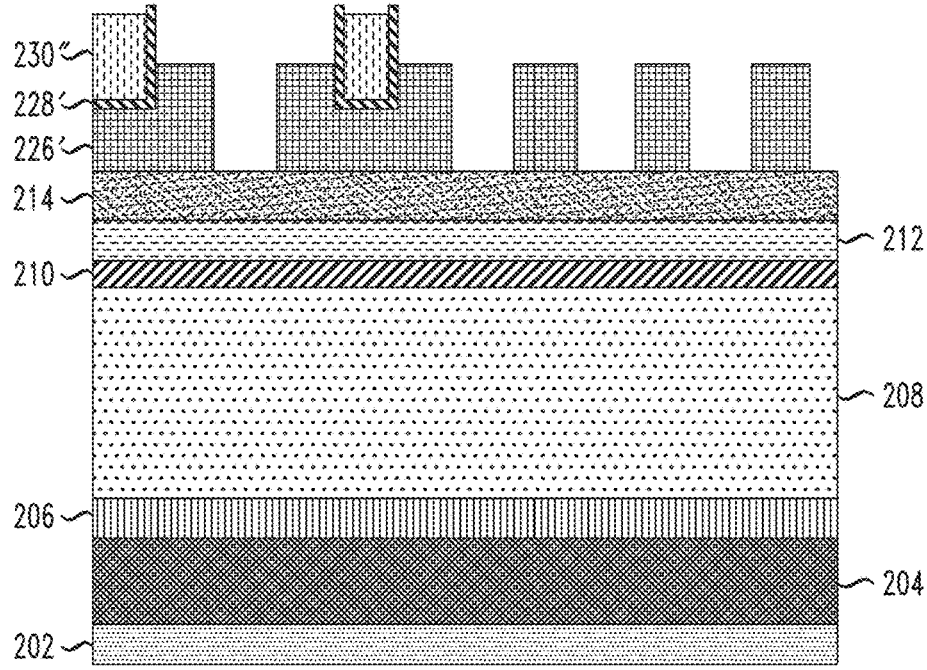
FIG. 13 depicts a side cross-sectional view of the FIG. 12 structure following removal of the mandrels, according to an embodiment of the invention.

FIG. 13 shows a side cross-sectional view 1300 of the FIG. 12 structure following removal of the mandrels 216'. The mandrels 216' may be pulled or otherwise removed using any suitable processing that removes the material of the mandrels 216' but not the material of the first spacer 226', HM 214, HM 228' and the second spacer 230".

FIG. 14 shows a side cross-sectional view 1400 of the FIG. 13 structure following an optional block-level patterning. The block-level patterning forms an ODL 240, coating layer 242 and resist layer 244 over a region exposed by removal of one of the mandrels 216'. It should be appreciated that the block-level patterning may involve forming an ODL, coating layer and resist layer to cover multiple different regions exposed by removal of multiple ones of the mandrels 216', although just one is shown in FIG. 14 for clarity of illustration. The ODL 240, coating layer 242 and resist layer 244 may be formed using similar materials, processing and sizing as that described above with respect to the ODL 234, coating layer 236 and resist layer 238, respectively.

FIG. 15 shows a side cross-sectional view 1500 of the FIG. 14 structure following etching of exposed portions of the HM 214. The exposed portions of the HM 214 may be etched using any suitable processing that removes the exposed portions of the hard mask material of HM 214 but not the TEOS 212. The remaining portions of the HM 214 are labeled as HM 214' in FIG. 15.

Figure 16:
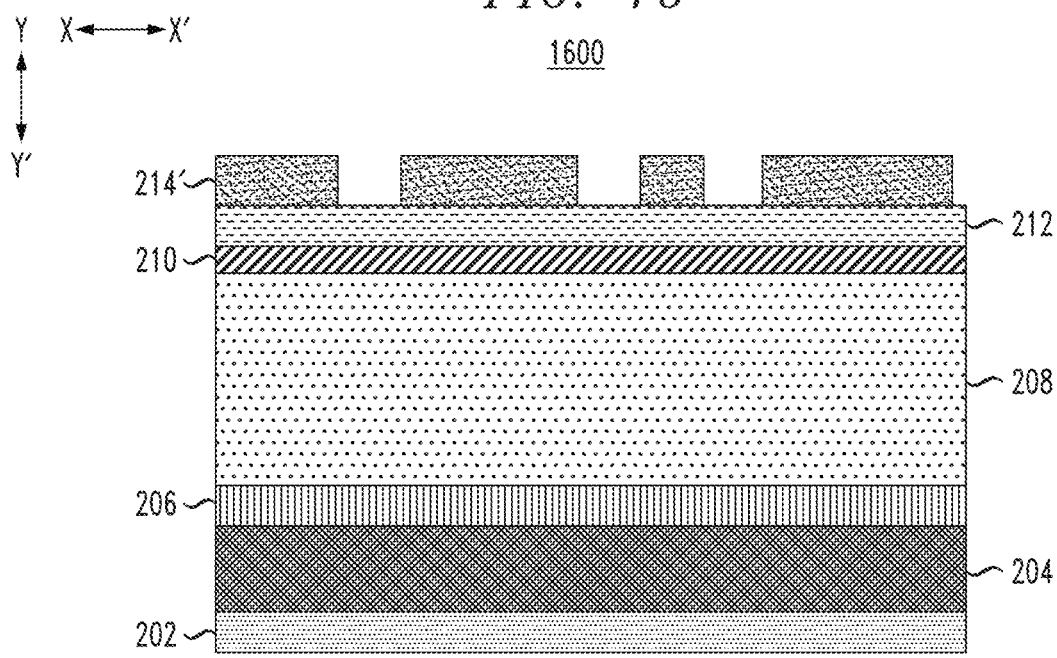
FIG. 16 depicts a side cross-sectional view of the FIG. 15 structure following removal of remaining portions of the first and second spacers, according to an embodiment of the invention.

FIG. 16 shows a side cross-sectional view 1600 of the FIG. 15 structure following removal of remaining portions of the first spacer 226' and second spacer 230', using any suitable processing that removes the materials of the first spacer 226' and second spacer 230'. The HM 228', ODL 240, coating layer 242 and resist layer 244 are also removed.

Figure 17:
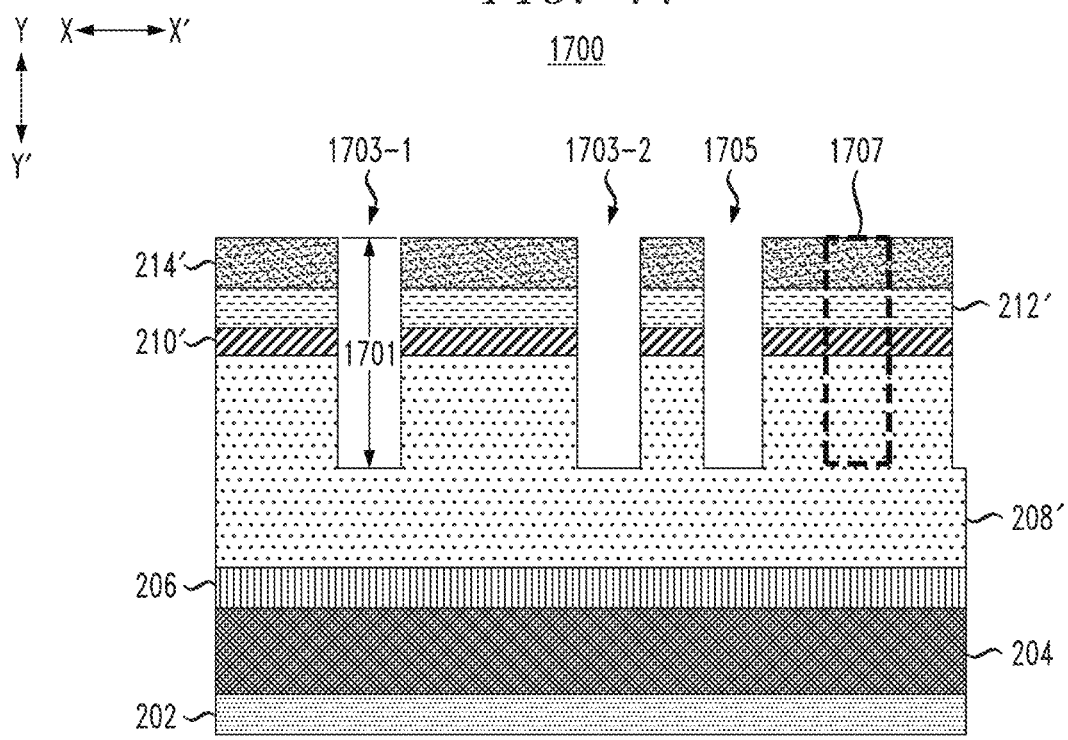
FIG. 17 depicts a side cross-sectional view of the FIG. 16 structure following a directional etch of the exposed hard masks and dielectric layer, according to an embodiment of the invention.

FIG. 17 shows a side cross-sectional view 1700 of the FIG. 16 structure following a directional etch of the TEOS 212, the HM 210 and the dielectric layer 208. The directional etch may utilize RIE or other suitable processing. Remaining portions of the TEOS 212, HM 210 and dielectric layer 208 are labeled as TEOS 212', HM 210' and dielectric layer 208. The directional etch may be to a depth 1701 in the range of about half the thickness (in direction Y-Y') of the dielectric layer 208. FIG. 17 illustrates two "mandrel cuts" 1703-1 and 1703-2 (collectively, mandrel cuts 1703) that correspond to regions where the mandrels 216' were pulled, as well as a "non-mandrel cut" 1705. Using the spacer-merge region described above with respect to FIG. 7, the two mandrel cuts 1703 have a relatively large distance between one another (e.g., as compared to the distance between the mandrel cut 1703-2 and non-mandrel cut 1705). For example, the distance (in direction X-X') between the two mandrel cuts 1703-1 and 1703-2 may be approximately twice that of the distance between the mandrel cut 1703-2 and the non-mandrel cut 1705. FIG. 17 also illustrates a region 1707 where the optional block-level patterning described above with respect to FIG. 14 prevents the formation of a mandrel cut.

Figure 18:
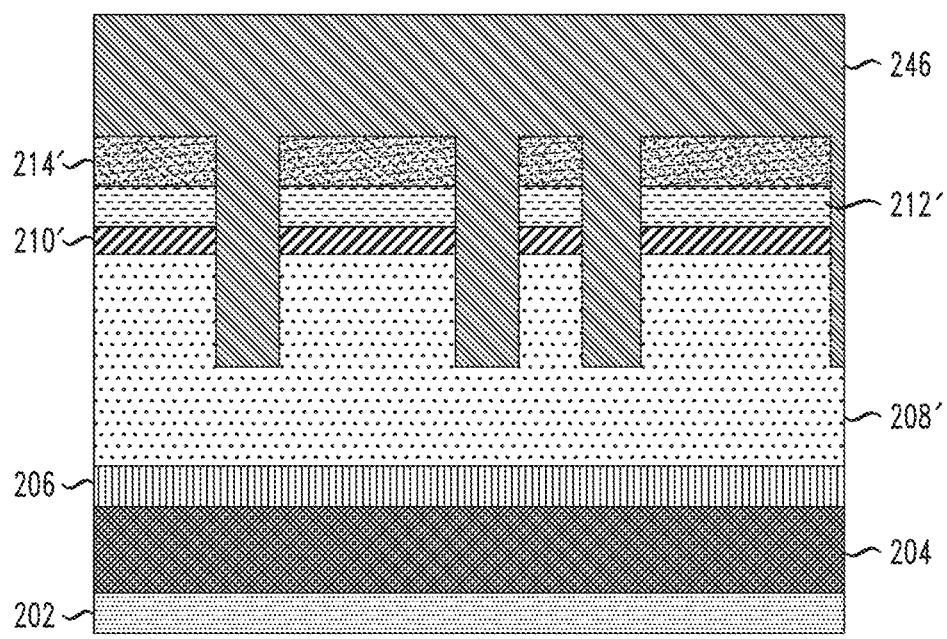
FIG. 18 depicts a side cross-sectional view of the FIG. 17 structure following formation of an interconnect structure, according to an embodiment of the invention.

FIG. 18 shows a side cross-sectional view 1800 of the FIG. 17 structure following formation of an interconnect structure 246. The interconnect structure 246 may include a liner formed of tantalum (Ta), tantalum nitride (TaN), ruthenium (Ru), cobalt (Co) or another suitable material, followed by a seed layer formed of copper (Cu) using any suitable deposition processing. A metal such as copper (Cu) or another suitable material is formed over the liner or seed layer (e.g., such as by plating Cu or using other suitable processing). The liner may have a uniform thickness in the range of a few nanometers, and the seed layer may have a thickness in the range of a few nanometers to tens of nanometers. The metal may overfill the structure, such that a top surface of the interconnect structure 246 has a height which exceeds the height of the top surface of the HM 214'.

Figure 19:
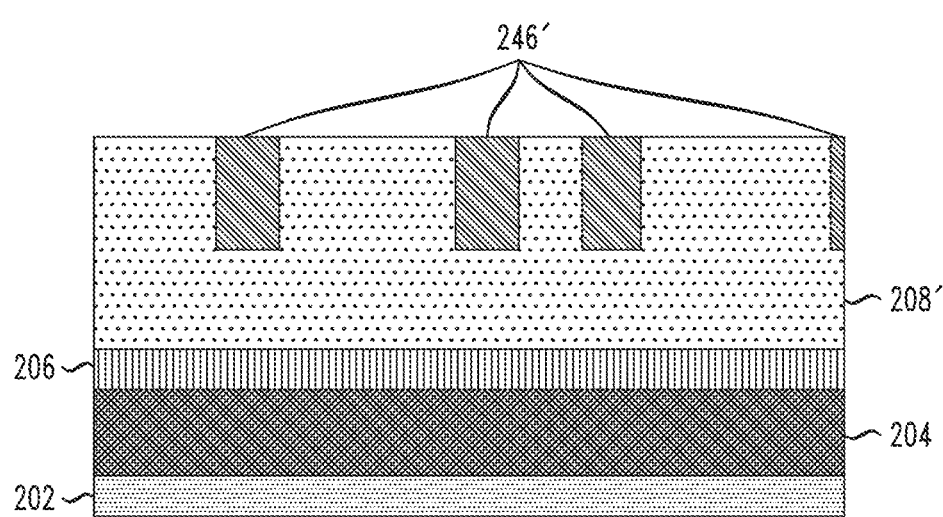
FIG. 19 depicts a side cross-sectional view of the FIG. 18 structure following planarization of the interconnect structure to form a set of interconnects, according to an embodiment of the invention.

FIG. 19 shows a side cross-sectional view 1900 of the FIG. 18 structure following planarization of the interconnect structure 246, such as using chemical mechanical planarization (CMP). The planarization process removes the remaining portions of the TEOS 212' and HM 210' and the portions of the interconnect structure 246 formed above the top surface of the dielectric layer 208'. The remaining portions of the interconnect structure 246 provide interconnects 246'.

FIG. 20 shows a top-down view 2000 of an example structure including a set of mandrel lines, non-mandrel lines and spacer-merge regions. The spacer-merge regions are formed in areas where the non-mandrel lines are not desired in the resulting structure (e.g., portions of the non-mandrel lines which would otherwise result in non-mandrel "dummy" lines being printed). Using the spacer-merge regions, non-mandrel dummy line density may be reduced in this example by approximately 21.5%. As shown in FIG. 20, different ones of the mandrel and non-mandrel lines may have different widths (in direction Z-Z'). The non-mandrel lines have various end-cuts in the direction X-X' as illustrated.

Each of the spacer-merge regions starts and ends on mandrel lines in a first direction (in direction Z-Z'), and completely covers portions of the non-mandrel lines between such mandrel lines in a second direction (in direction X-X') orthogonal to the first direction. For example, spacer-merge region 2006-1 starts on mandrel line 2002-1 and ends on mandrel line 2002-2 in direction Z-Z', and completely covers a portion of the non-mandrel line 2004-1 between the mandrel lines 2002-1 and 2002-2. It should be appreciated, however, that a spacer-merge region is not limited solely to covering a single non-mandrel line or to starting and ending on two adjacent mandrel lines. For example, spacer-merge region 2006-2 starts on mandrel line 2002-3 and has a first portion which spans across to mandrel line 2002-4, covering a portion of non-mandrel lines 2004-2 and 2004-3. A second portion of the spacer-merge region 2006-2 further spans across mandrel lines 2002-4 and 2002-5 and ends on mandrel line 2002-6, covering non-mandrel lines 2004-4 and 2004-5. Various other types of spacer-merge shapes may be formed as desired based on the desired pattern of non-mandrel lines that are to be printed to underlying layers of the structure.

In some embodiments, a method of forming a semiconductor structure comprises forming a dielectric layer, forming a plurality of mandrel lines over the dielectric layer, and forming a plurality of non-mandrel lines over the dielectric layer between adjacent ones of the plurality of mandrel lines utilizing self-aligned double patterning. The method also comprises forming at least one spacer-merge region, the at least one spacer-merge region extending from a first portion of a first one of the plurality of mandrel lines to a second portion of a second one of the plurality of mandrel lines in a first direction and covering at least a portion of one or more of the plurality of non-mandrel lines between the first mandrel and the second mandrel in a second direction orthogonal to the first direction. The method further comprises forming a plurality of trenches in the dielectric layer by transferring a pattern of (i) the plurality of mandrel lines and (ii) portions of the plurality of non-mandrel lines outside the at least one spacer-merge region.

The method may further comprise forming a first hard mask layer over the dielectric layer, forming the plurality of mandrels over the first hard mask layer, and forming first spacers by depositing a first spacer material over the first hard mask layer and the plurality of mandrels. The method may further comprise forming a second hard mask layer over the first spacer material, and forming second spacers over the second mask layer, wherein forming the second spacers comprises depositing a second spacer material different than the first spacer material and etching back the second spacer material to expose portions of the second hard mask layer formed over the plurality of mandrels.

The method may further comprise patterning a third hard mask layer over at least a portion of the second spacers and the second hard mask layer, the third hard mask layer defining the at least one spacer-merge region. The first spacer material may comprise a first oxide formed using LTO, the second spacer material may comprise a second oxide formed using a gap-filling FCVD process, and the third hard mask layer may comprise SiN formed using ALD. Patterning the third hard mask layer may comprise depositing a hard mask material for the third hard mask layer, forming a patterning stack over a portion of the hard mask material for the third hard mask layer, the patterning stack comprising an ODL, a coating layer and a resist layer, etching portions of the hard mask material for the third hard mask layer exposed by the patterning stack, and removing the patterning stack.

The method may further comprise removing portions of the second spacers exposed by the third hard mask layer, wherein removing the portions of the second spacers exposed by the third hard mask layer utilizes an etching process that removes the second spacer material selective to the first spacer material, and removing the third hard mask layer. The third hard mask layer prevents removal of portions of the second spacers in the at least one spacer-merge region.

The method may further comprise removing portions of the second hard mask layer to expose a top surface of the first spacer material formed over tops of the plurality of mandrels. The method may further comprise performing a directional etch of the first spacer material to expose a top surface of portions of the first hard mask layer between adjacent pairs of the plurality of mandrels outside the at least one spacer-merge region, and removing the plurality of mandrels to expose additional portions of the first hard mask layer. The method may further comprise etching exposed portions of the first hard mask layer, and removing remaining portions of the first spacer, the second spacer and the second hard mask layer.

Forming the plurality of trenches in the dielectric layer may comprise etching portions of the dielectric layer exposed by remaining portions of the first hard mask layer. The method may further comprise forming a plurality of interconnect lines in the plurality of trenches, wherein forming the plurality of interconnect lines comprises depositing an interconnect material in the plurality of trenches and over a top surface of the remaining portions of the first mask layer, and planarizing the interconnect material, wherein planarizing the interconnect material removes the remaining portions of the first mask layer.

The method may further comprise forming a patterning stack to cover at least a portion of the top surface of the first hard mask layer exposed by removal of at least one of the set of mandrels, the patterning stack comprising an ODL, a coating layer and a resist layer, etching exposed portions of the first hard mask layer, and removing the additional patterning stack.

In some embodiments, a semiconductor structure comprises a dielectric layer and a plurality of interconnect lines disposed in a plurality of trenches in the dielectric layer. The plurality of trenches comprise a first set of trenches defined by a plurality of mandrel lines and a second set of trenches defined by a plurality of non-mandrel lines outside at least one spacer-merge region. The at least one spacer-merge region extends from a first portion of a first one of the plurality of mandrel lines to a second portion of a second one of the plurality of mandrel lines in a first direction and covers at least a portion of one or more of the plurality of non-mandrel lines between the first mandrel and the second mandrel in a second direction orthogonal to the first direction.

The at least one spacer-merge region may extend over a portion of at least one additional mandrel line disposed between the first mandrel line and the second mandrel line. The at least one spacer-merge region may completely cover portions of two or more of the plurality of non-mandrel lines between the first portion of the first mandrel line and the second portion of the second mandrel line.

In some embodiments, an integrated circuit comprises an interconnect structure comprising a dielectric layer and a plurality of interconnect lines disposed in a plurality of trenches in the dielectric layer. The plurality of trenches comprise a first set of trenches defined by a plurality of mandrel lines and a second set of trenches defined by a plurality of non-mandrel lines outside at least one spacer-merge region. The at least one spacer-merge region extends from a first portion of a first one of the plurality of mandrel lines to a second portion of a second one of the plurality of mandrel lines in a first direction and covers at least a portion of one or more of the plurality of non-mandrel lines between the first mandrel and the second mandrel in a second direction orthogonal to the first direction.

The at least one spacer-merge region may extend over a portion of at least one additional mandrel line disposed between the first mandrel line and the second mandrel line. The at least one spacer-merge region may completely cover portions of two or more of the plurality of non-mandrel lines between the first portion of the first mandrel line and the second portion of the second mandrel line.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
   forming a dielectric layer;
   forming a plurality of mandrel lines over the dielectric layer;
   forming a plurality of non-mandrel lines over the dielectric layer between adjacent ones of the plurality of mandrel lines utilizing self-aligned double patterning;
   forming at least one spacer-merge region, the at least one spacer-merge region extending from a first portion of a first one of the plurality of mandrel lines to a second portion of a second one of the plurality of mandrel lines in a first direction and covering at least a portion of one or more of the plurality of non-mandrel lines between the first mandrel and the second mandrel in a second direction orthogonal to the first direction; and
   forming a plurality of trenches in the dielectric layer by transferring a pattern of (i) the plurality of mandrel lines and (ii) portions of the plurality of non-mandrel lines outside the at least one spacer-merge region.

2. The method of claim 1, further comprising:
   forming a first hard mask layer over the dielectric layer;
   forming the plurality of mandrels over the first hard mask layer; and
   forming first spacers by depositing a first spacer material over the first hard mask layer and the plurality of mandrels.

3. The method of claim 2, further comprising:
   forming a second hard mask layer over the first spacer material; and
   forming second spacers over the second mask layer.

4. The method of claim 3, wherein forming the second spacers comprises depositing a second spacer material different than the first spacer material and etching back the second spacer material to expose portions of the second hard mask layer formed over the plurality of mandrels.

5. The method of claim 4, wherein the first spacer material comprises a first oxide formed using a low temperature oxidation process, and wherein the second spacer material comprises a second oxide formed using a gap-filling flowable chemical vapor deposition process.

6. The method of claim 5, further comprising patterning a third hard mask layer over at least a portion of the second spacers and the second hard mask layer, the third hard mask layer defining the at least one spacer-merge region.

7. The method of claim 6, wherein the third hard mask layer comprises silicon nitride formed using atomic layer deposition.

8. The method of claim 6, wherein patterning the third hard mask layer comprises:
   depositing a hard mask material for the third hard mask layer;
   forming a patterning stack over a portion of the hard mask material for the third hard mask layer, the patterning stack comprising an organic dielectric layer, a coating layer and a resist layer;
   etching portions of the hard mask material for the third hard mask layer exposed by the patterning stack; and
   removing the patterning stack.

9. The method of claim 6, further comprising:
   removing portions of the second spacers exposed by the third hard mask layer, wherein removing the portions of the second spacers exposed by the third hard mask layer utilizes an etching process that removes the second spacer material selective to the first spacer material; and
   removing the third hard mask layer.

10. The method of claim 9, wherein the third hard mask layer prevents removal of portions of the second spacers in the at least one spacer-merge region.

11. The method of claim 9, further comprising removing portions of the second hard mask layer to expose a top surface of the first spacer material formed over tops of the plurality of mandrels.

12. The method of claim 9, further comprising:
   performing a directional etch of the first spacer material to expose a top surface of portions of the first hard mask layer between adjacent pairs of the plurality of mandrels outside the at least one spacer-merge region; and
   removing the plurality of mandrels to expose additional portions of the first hard mask layer.

13. The method of claim 12, further comprising:
   etching exposed portions of the first hard mask layer; and
   removing remaining portions of the first spacer, the second spacer and the second hard mask layer.

14. The method of claim 13, wherein forming the plurality of trenches in the dielectric layer comprises etching portions of the dielectric layer exposed by remaining portions of the first hard mask layer.

15. The method of claim 14, further comprising forming a plurality of interconnect lines in the plurality of trenches, wherein forming the plurality of interconnect lines comprises depositing an interconnect material in the plurality of trenches and over a top surface of the remaining portions of the first mask layer.

16. The method of claim 15, wherein forming the plurality of interconnect lines further comprises planarizing the interconnect material.

17. The method of claim 16, wherein planarizing the interconnect material removes the remaining portions of the first mask layer.

18. The method of claim 12, further comprising:
   forming a patterning stack to cover at least a portion of the top surface of the first hard mask layer exposed by removal of at least one of the set of mandrels, the patterning stack comprising an organic dielectric layer, a coating layer and a resist layer;
   etching exposed portions of the first hard mask layer; and
   removing the additional patterning stack.

19. The method of claim 1, wherein the at least one spacer-merge region extends over a portion of at least one additional mandrel line disposed between the first mandrel line and the second mandrel line.

20. The method of claim 1, wherein the at least one spacer-merge region completely covers portions of two or more of the plurality of non-mandrel lines between the first portion of the first mandrel line and the second portion of the second mandrel line.

* * * * *